(12) United States Patent
Arisaka et al.

(10) Patent No.: US 7,872,520 B2
(45) Date of Patent: Jan. 18, 2011

(54) SEMICONDUCTOR INTEGRATED CIRCUIT DEVICE

(75) Inventors: Naoya Arisaka, Tokyo (JP); Takayasu Ito, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/475,867

(22) Filed: Jun. 1, 2009

(65) Prior Publication Data

US 2010/0019835 A1     Jan. 28, 2010

(30) Foreign Application Priority Data

Jul. 22, 2008     (JP) .............................. 2008-188144

(51) Int. Cl.
*G05F 1/10*     (2006.01)
(52) U.S. Cl. ........................ 327/541; 327/566
(58) Field of Classification Search ............... 323/311, 323/312, 313, 314, 315; 327/540, 541, 564, 327/565, 566
See application file for complete search history.

(56) References Cited

U.S. PATENT DOCUMENTS

| 6,407,538 | B1 * | 6/2002 | Kinoshita et al. ........... 323/314 |
| 7,209,770 | B2 | 4/2007 | Agari et al. |
| 7,728,565 | B2 * | 6/2010 | Wyatt ........................ 323/269 |

FOREIGN PATENT DOCUMENTS

JP     2004-193475 A     7/2004

* cited by examiner

*Primary Examiner*—Jeffrey S Zweizig
(74) *Attorney, Agent, or Firm*—Mattingly & Malur, P.C.

(57) ABSTRACT

A semiconductor integrated circuit device which substantially reduces drop in a supply voltage generated by a regulator and ensures stable supply of a supply voltage with high efficiency and high accuracy. In the device, a memory power supply includes a plurality of transistors and an error amplifier. In the transistors, source pads and drain pads are alternately arranged in a row along one edge of a semiconductor chip in a peripheral area of the chip. Transistor gates are formed in parallel with the alternately arranged source pads and drain pads (so that the longitudinal direction of the gates is parallel to the direction of the arrangement of the source pads and drain pads). Consequently, the length of wirings coupled to drains and sources is shortened and the sheet resistance is decreased.

8 Claims, 19 Drawing Sheets

US 7,872,520 B2

SEMICONDUCTOR INTEGRATED CIRCUIT DEVICE

CROSS-REFERENCE TO RELATED APPLICATIONS

The disclosure of Japanese Patent Application No. 2008-188144 filed on Jul. 22, 2008 including the specification, drawings and abstract is incorporated herein by reference in its entirety.

BACKGROUND OF THE INVENTION

The present invention relates to technology for power supply generation by a regulator and more particularly relates to technology for supplying a supply voltage in system-in-packages.

In the semiconductor integrated circuit device field, a system-in-package (SiP) is known in which more than one semiconductor chip are mounted in a single package.

System-in-package type semiconductor integrated circuit devices include those in which a system LSI such as a microcomputer and a large-capacity nonvolatile memory are packaged and it is known that some of such semiconductor integrated circuit devices incorporate an on-chip regulator to drive the nonvolatile memory.

In recent years, as the tendency for electronic systems to consume less power is growing, the operating voltages of semiconductor integrated circuit devices are lower than before. In some semiconductor integrated circuit devices, the supply voltage VCC is very close to the operating voltage of the nonvolatile memory, so it is important to prevent voltage drop in the power which the regulator supplies to the nonvolatile memory.

In this connection, one example of the known techniques for preventing voltage drop is that the regulator wiring is multilayered to reduce the sheet resistance of the wiring.

For semiconductor integrated circuit devices which use this type of regulator, a layout technique is known in which series regulators are mounted diagonally to a switching regulator on a semiconductor chip in order to reduce the influence of high frequency noise (see Japanese Unexamined Patent Publication No. 2004-193475).

SUMMARY OF THE INVENTION

However, the present inventors have found that the above technique for preventing the supply voltage supplied by the regulator from dropping has the following problem.

In recent years, there has been a tendency that nonvolatile memories have a larger memory capacity and thus require a larger current. Multilayered wiring may not be able to cope with such a large current and as mentioned above, if the supply voltage VCC supplied to a semiconductor integrated circuit device is very close to the operating voltage of the nonvolatile memory, stability in the operating voltage may not be ensured even with a slight voltage drop.

An object of the present invention is to provide a technique to drastically reduce drop in the supply voltage generated by a regulator and ensure stable supply of supply voltage efficiently and accurately.

The above and further objects and novel features of the invention will more fully appear from the following detailed description in this specification and the accompanying drawings.

The outline of the typical aspect of the inventions disclosed in the present application will be simply described as follows.

According to one aspect of the present invention, in a semiconductor integrated circuit device having a regulator for converting a DC supply voltage into a given DC voltage, the regulator includes: an output driver having a plurality of transistors; input voltage pads for supplying a supply voltage to sources of the transistors; and output voltage pads coupled to drains of the transistors to output a given DC voltage. Here, the input voltage pads and the output voltage pads are arranged in a row along one edge of a semiconductor chip where the regulator is formed, and gates of the transistors are parallel to arrangement of the input voltage pads and the output voltage pads.

Another aspect of the inventions will be simply described as follows.

Preferably the semiconductor integrated circuit device further includes: a first main line coupled to the input voltage pad; a first branch line extending from the first main line to supply a voltage to a first diffusion layer of the transistor; a second main line coupled to the output voltage pad; and a second branch line extending from the second main line to supply a voltage from a second diffusion layer of the transistor to the output voltage pad. Here, the first branch line and the second branch line are parallel to arrangement of the input voltage pads and the output voltage pads.

The input voltage pads and the output voltage pads may be alternately arranged.

Also the input voltage pads may be arranged in a row as a first group and the output voltage pads may be arranged in a row as a second group and the first group and the second group may be arranged in a row.

The transistors may be coupled in parallel with each other while their sources, drains and gates are coupled in common respectively.

Preferably, the semiconductor integrated circuit device is a system in package including at least two semiconductor chips. Here, the regulator supplies a given converted DC voltage to the other semiconductor chip where the regulator does not exist, or another semiconductor chip externally coupled to the semiconductor integrated circuit device.

The regulator may supply a given converted DC voltage to another semiconductor chip externally coupled to the semiconductor integrated circuit device.

The semiconductor integrated circuit device may be a controller having a CPU (Central Processing Unit).

The advantageous effects achieved by the preferred embodiments of the present invention are briefly summarized as follows:

(1) A DC supply voltage can be supplied accurately with less voltage drop.

(2) The semiconductor integrated circuit device can ensure a higher reliability and provide a higher performance.

(3) The area of the regulator can be small and the semiconductor integrated circuit device can be compact.

DETAILED DESCRIPTION OF THE PREFERRED EMBODIMENTS

Figure 1:
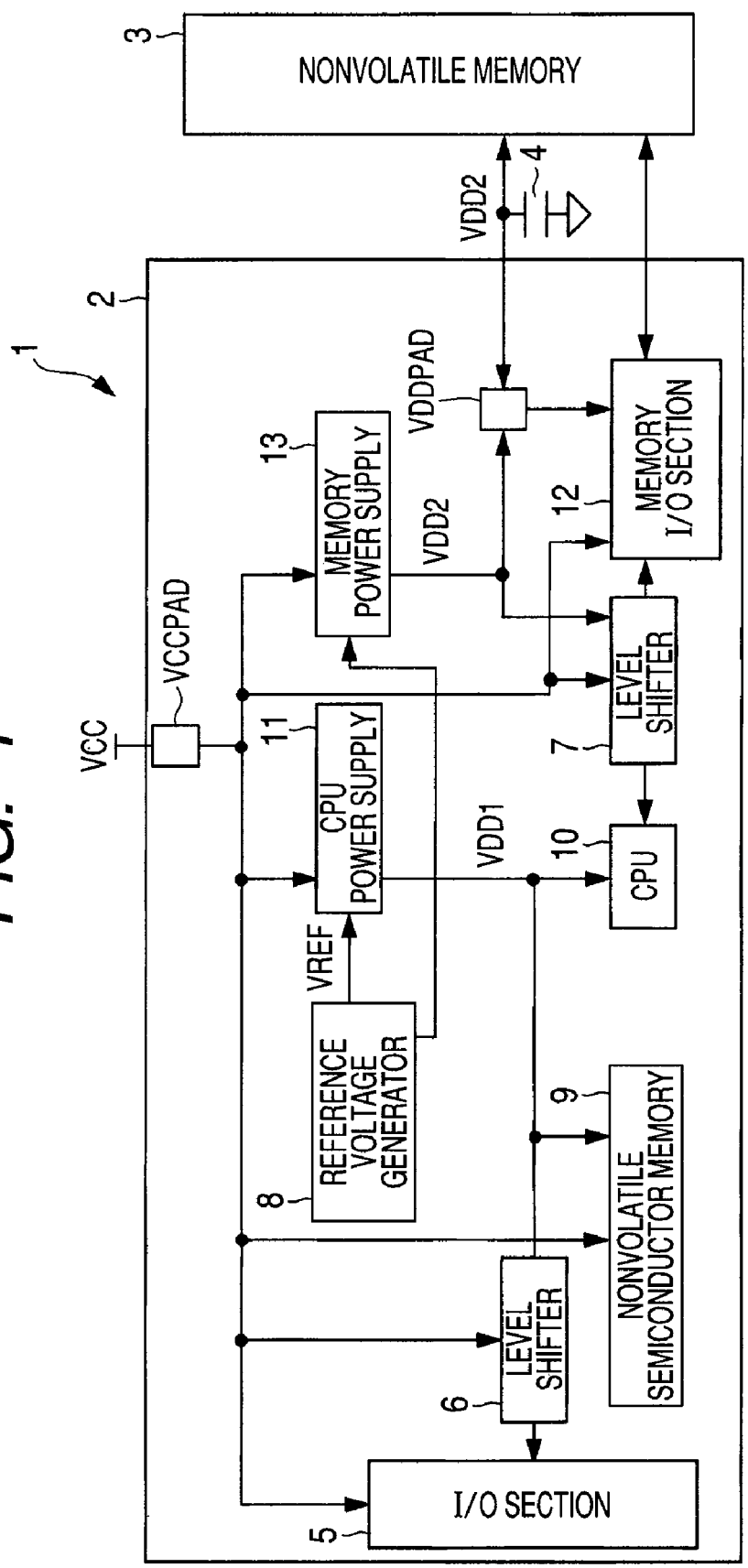
FIG. 1 is a block diagram showing the configuration of a semiconductor integrated circuit device according to a first embodiment of the present invention.

Next, the preferred embodiments of the present invention will be described in detail referring to the accompanying drawings. Basically in all the drawings that illustrate the preferred embodiments, elements with like functions are designated by like reference numerals and repeated descriptions thereof are omitted.

First Embodiment

Figure 2:
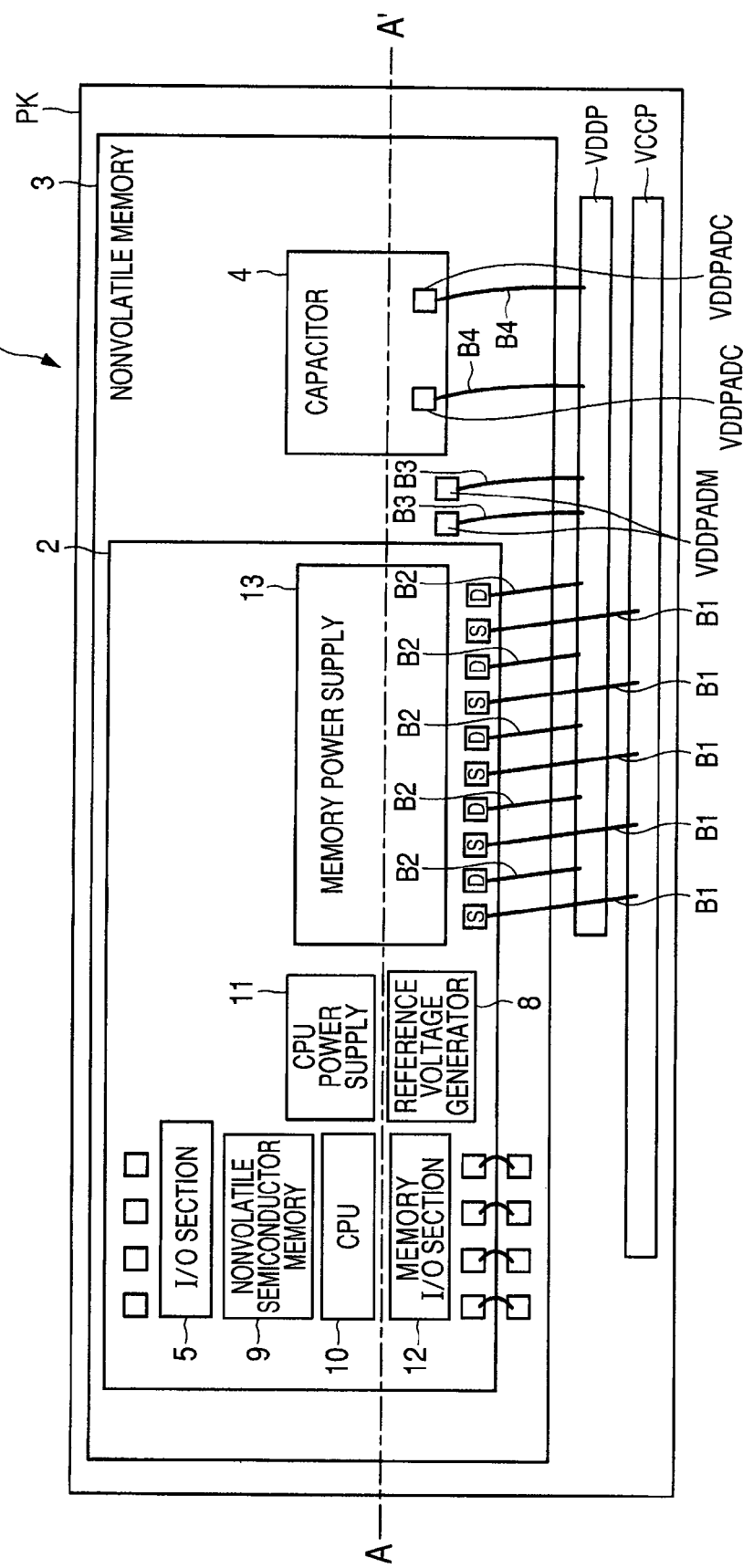
FIG. 2 illustrates an example of package layout of the semiconductor integrated circuit device shown in FIG. 1.
Figure 3:
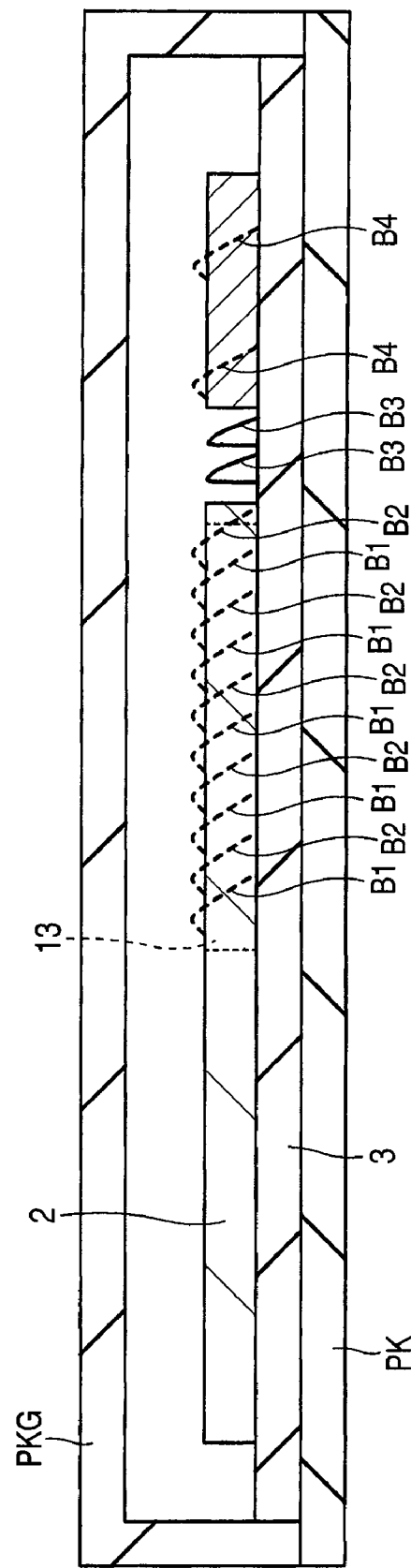
FIG. 3 is a sectional view taken along A-A' in FIG. 2.
Figure 4:
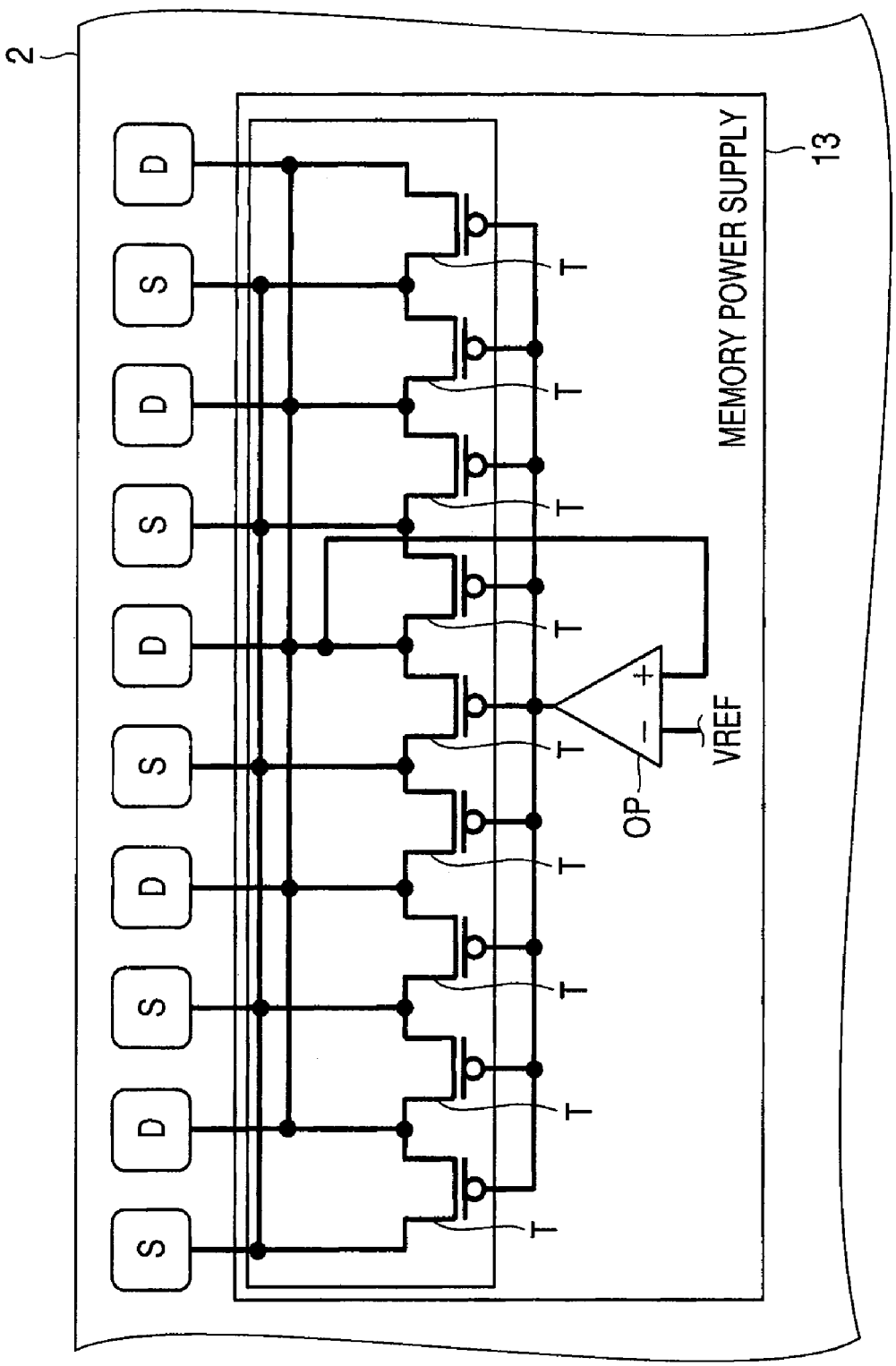
FIG. 4 shows an example of the arrangement and connection pattern of source pads and drain pads in a memory power supply of the semiconductor integrated circuit device in FIG. 1.
Figure 5:
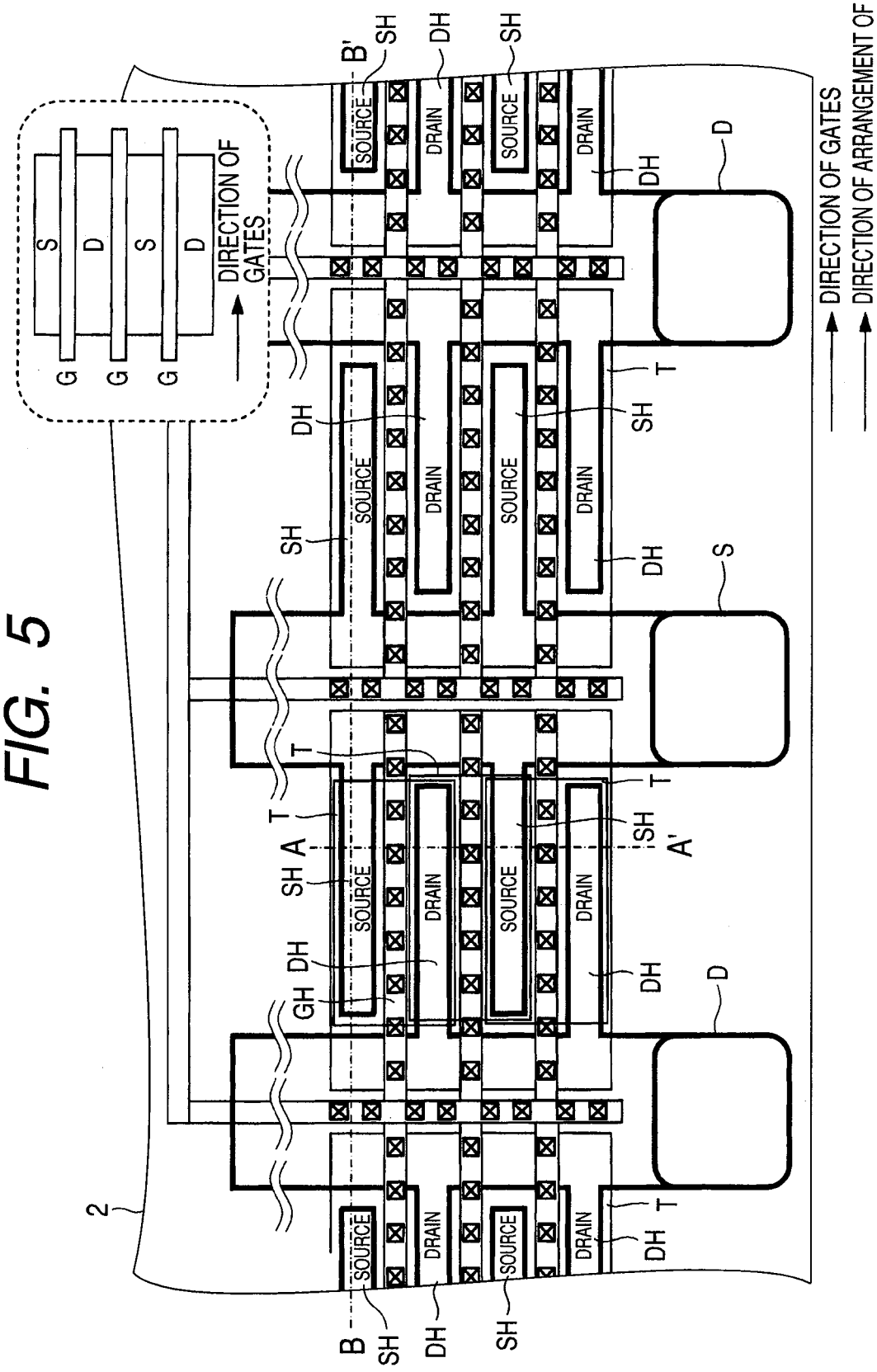
FIG. 5 illustrates an example of the layout pattern of the transistors in the memory power supply shown in FIG. 4.
Figure 6:
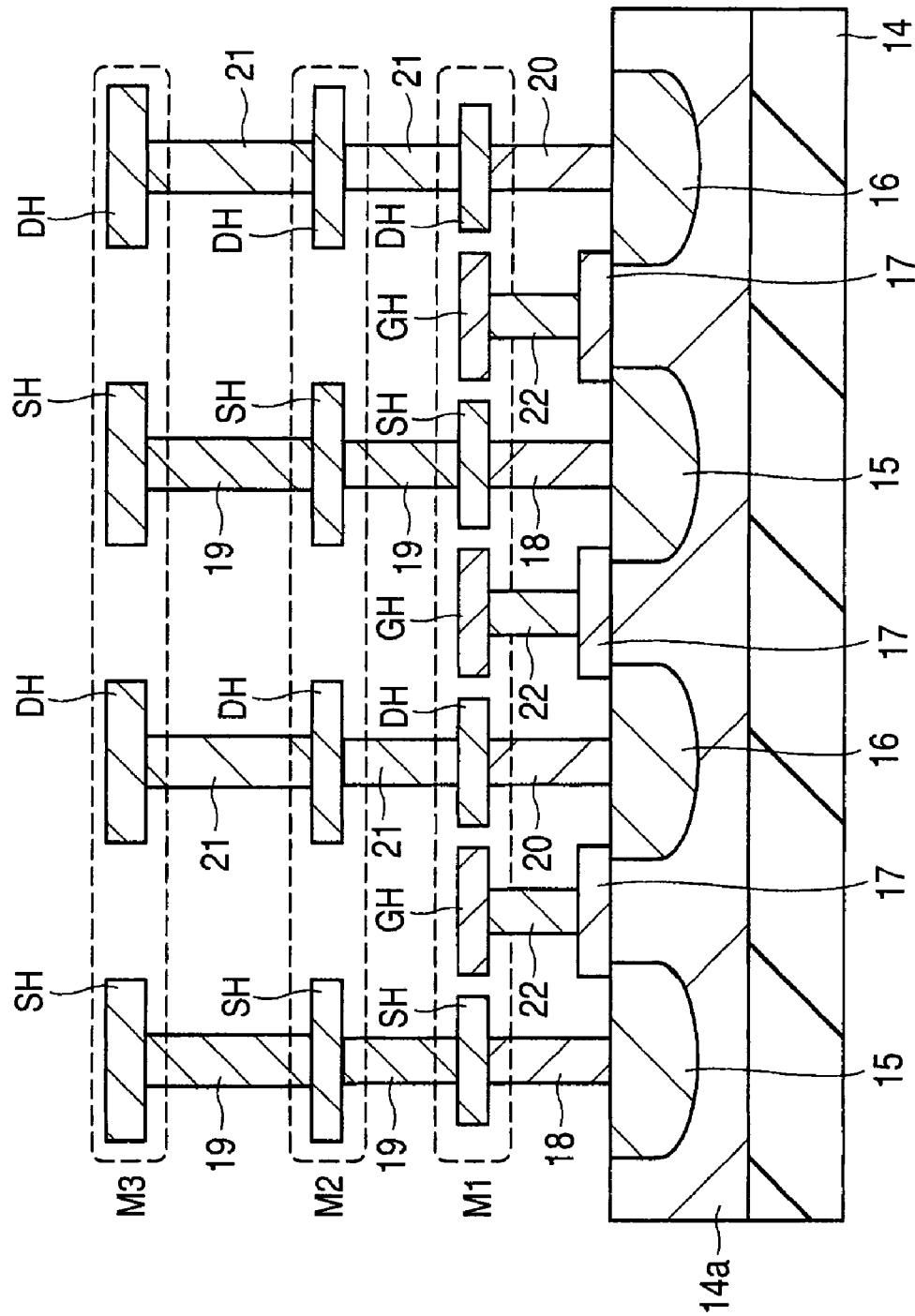
FIG. 6 is a sectional view taken along the line A-A' in FIG. 5.
Figure 7:
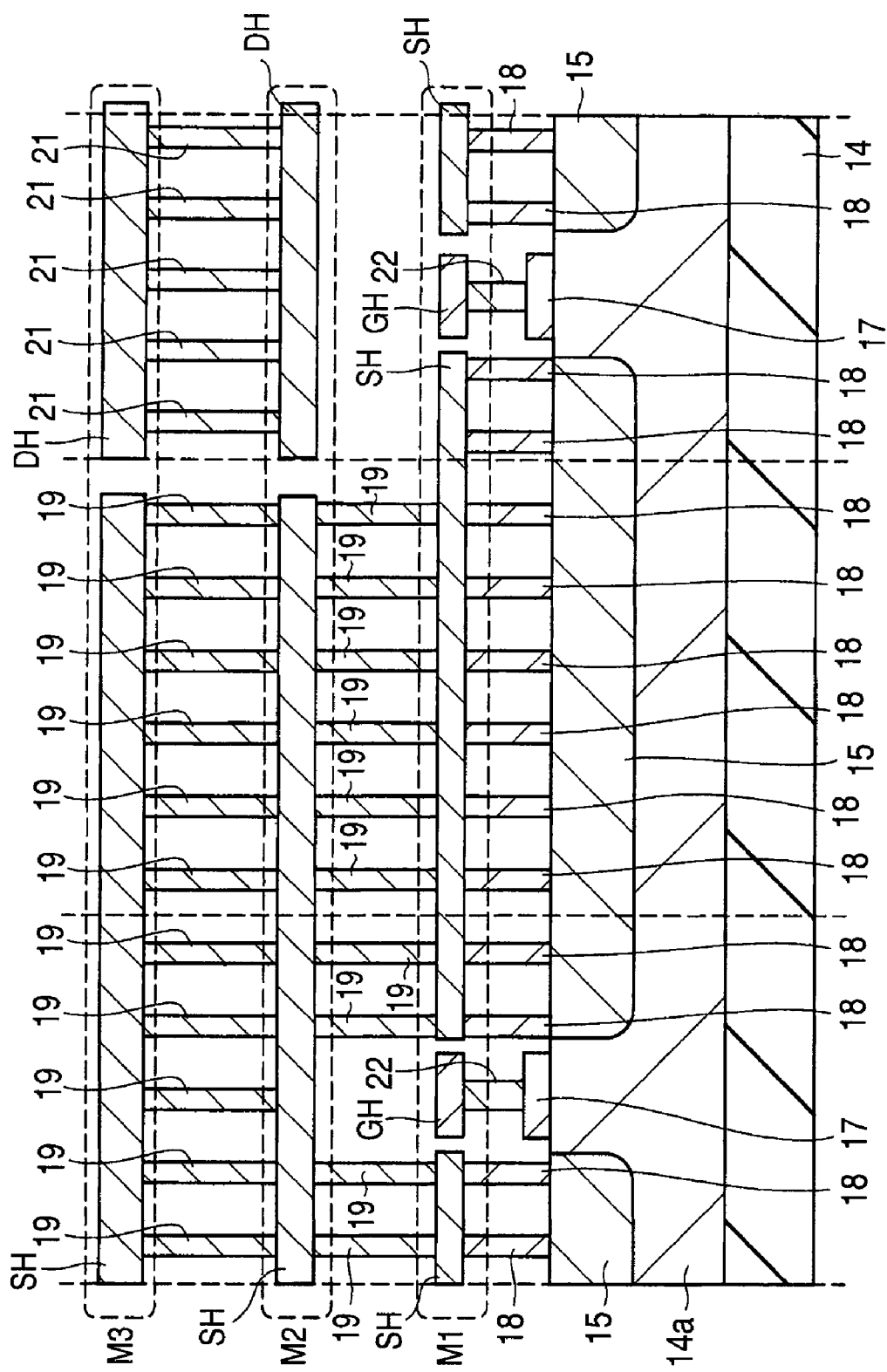
FIG. 7 is a sectional view taken along the line B-B' in FIG. 5.
Figure 8:
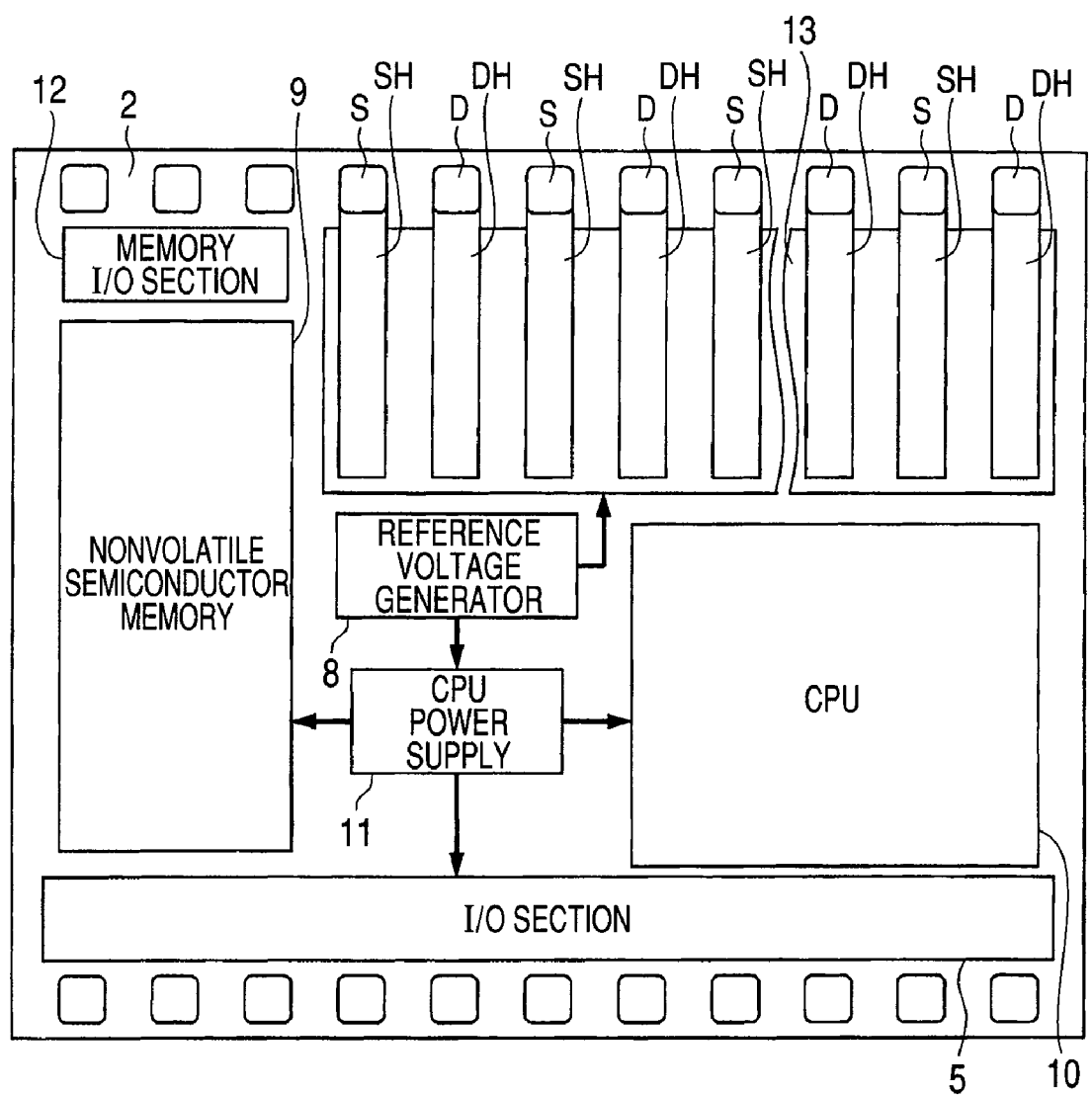
FIG. 8 illustrates an example of the arrangement of drain wirings and source wirings in the memory power supply in FIG. 4.
Figure 9:
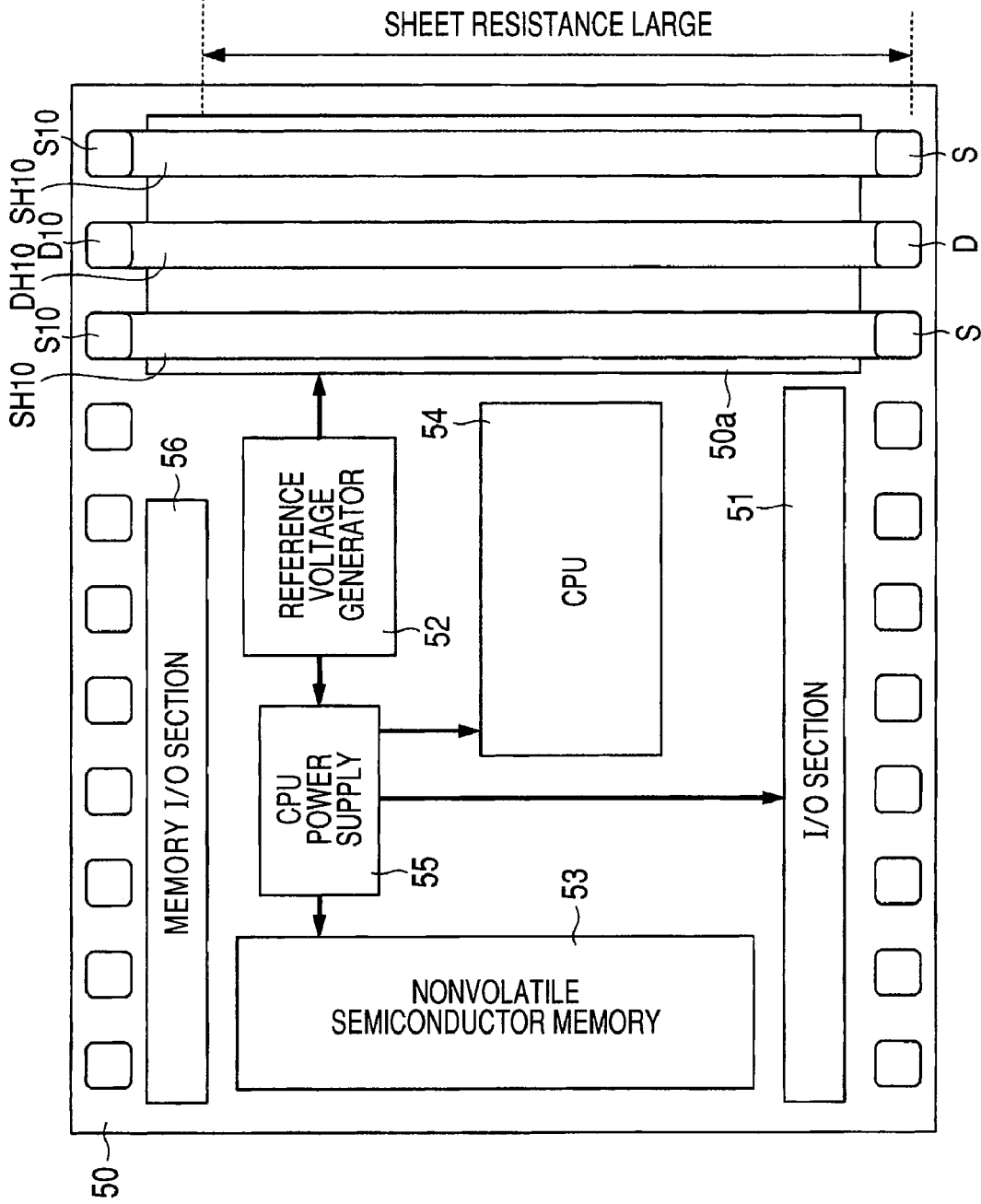
FIG. 9 illustrates the arrangement of drain wirings and source wirings in the memory power supply which the present inventors have investigated.

FIG. 1 is a block diagram showing the configuration of a semiconductor integrated circuit device according to a first embodiment of the present invention; FIG. 2 illustrates an example of package layout of the semiconductor integrated circuit device shown in FIG. 1; FIG. 3 is a sectional view taken along A-A' in FIG. 2; FIG. 4 shows an example of the arrangement and connection pattern of source pads and drain pads in a memory power supply of the semiconductor integrated circuit device in FIG. 1; FIG. 5 illustrates an example of the layout pattern of the transistors in the memory power supply shown in FIG. 4; FIG. 6 is a sectional view taken along the line A-A' in FIG. 5; FIG. 7 is a sectional view taken along the line B-B' in FIG. 5; FIG. 8 illustrates an example of the arrangement of drain wirings and source wirings in the memory power supply in FIG. 4; and FIG. 9 illustrates the arrangement of drain wirings and source wirings in the memory power supply which the inventors have investigated.

In the first embodiment, a semiconductor integrated circuit device 1 is a system in package in which a plurality of semiconductor chips are mounted in a single package. As shown in FIG. 1, it includes a microcomputer 2, a nonvolatile memory 3, and a capacitor 4. The microcomputer 2 and the nonvolatile memory 3 are each formed on a single semiconductor chip.

The microcomputer 2 includes an I/O section 5, level shifters 6 and 7, a reference voltage generator 8, a nonvolatile semiconductor memory 9, a CPU 10, a CPU power supply 11, and a memory I/O section 12, a memory power supply 13.

The I/O section 5, level shifter 6, nonvolatile semiconductor memory 9, CPU power supply 11, and memory power supply 13 are coupled so that the externally supplied supply voltage VCC is supplied through a power supply pad VCC-PAD to them.

The I/O section 5 is an interface for a device externally coupled to the semiconductor integrated circuit device 1. The level shifter 6 converts a supply voltage VDD1 amplitude signal sent from the internal logical circuit of the microcomputer 2 into a supply voltage VCC amplitude signal.

The reference voltage generator 8 generates a reference voltage VREF which is used when the CPU power supply 11 generates supply voltage VDD1 and when the memory power supply 13 generates supply voltage VDD2. For example, the nonvolatile semiconductor memory 9 is an EEPROM (Electronically Erasable and Programmable Read Only Memory) and stores various types of data and programs.

The CPU 10 totally controls the microcomputer 2. For example, the CPU power supply 11 is a regulator which generates supply voltage VDD1 from the externally supplied voltage VCC and supplies it to the level shifters 6 and 7, nonvolatile semiconductor memory 9, CPU 10 and memory I/O section 12.

The memory I/O section 12 is an interface for the nonvolatile memory 3 externally coupled to the microcomputer 2. The level shifter 7 converts a supply voltage VDD1 amplitude signal into a supply voltage VDD2 amplitude signal. For example, the memory power supply 13 is a regulator which generates supply voltage VDD2 from the externally supplied voltage VCC and supplies it to the nonvolatile memory 3 and level shifter 7.

In this case, supply voltage VDD2 generated by the memory power supply 13 is supplied through the power supply pad VDDPAD to the nonvolatile memory 3. The power supply pad VDDPAD is coupled to the capacitor 4 for power supply stabilization.

FIG. 2 shows an example of the package layout of the semiconductor integrated circuit device 1 and FIG. 3 is a sectional view taken along the line A-A' in FIG. 2.

As illustrated in FIG. 2, the nonvolatile memory 3 semiconductor chip is mounted over a package substrate PK and the microcomputer 2 semiconductor chip (left) and the capacitor 4 (right) are mounted over the nonvolatile memory 3 semiconductor chip, forming a multilayered structure.

Below the nonvolatile memory 3 semiconductor chip, power wiring VDDP and power wiring VCCP are formed over the package substrate PK. The power wiring VDDP is wiring for supplying supply voltage VDD2 to the nonvolatile memory 3 and the power wiring VCCP is wiring for supplying supply voltage VCC to the microcomputer 2.

In the microcomputer 2 semiconductor chip, the I/O section 5, nonvolatile semiconductor memory 9, CPU 10 and memory I/O section 12 are arranged downward from its left upper corner in order and on the right of them the CPU power supply 11 and reference voltage generator 8 are arranged downward in order.

The memory power supply 13 lies on the right of the CPU 10 and the reference voltage generator 8. Below the memory power supply 13, source pads S and drain pads D are alternately arranged in a row along one of the edges of the semiconductor chip.

Each of the source pads S as input voltage pads is coupled through bonding wire B1 to the power wiring VCCP and each of the drain pads D as output voltage pads is coupled through bonding wire B2 to the power wiring VDDP.

The power wiring VDDP is coupled to power pads VDD-PADM of the nonvolatile memory 3 through bonding wires B3 and to power pads VDDPADC of the capacitor 4 through bonding wires B4.

The nonvolatile memory 3, microcomputer 2, capacitor 4, bonding wires B1 to B4, drain pads D, source pads S, power wirings VDDP and VCCP, and power pads VDDPADM and VDDPADC which are all mounted over the package substrate PK are sealed with resin or the like to form a package PKG.

FIG. 4 illustrates an example of the arrangement and connection pattern of the source pads S and drain pads D in the memory power supply 13.

The memory power supply 13 includes a plurality of transistors T which serve as an output driver, and a series regulator as an error amplifier OP. The transistors T are, for example, p-channel MOS (Metal Oxide Semiconductor) transistors.

One connecting end (drain) of each of all the transistors T is coupled in common and similarly the other connecting end (source) of each of all the transistors T is coupled in common so that all the drains are coupled in parallel and all the sources are coupled in parallel. The drains of the transistors T are coupled to the drain pads D and the sources of the transistors T are coupled to the source pads S.

Therefore, supply voltage VCC is coupled to the one connecting ends or drains of the transistors T and the other connecting ends or sources of the transistors output supply voltage VDD2.

Therefore, the drain pads D and source pads S are arranged alternately and sources (or drains) of neighboring transistors T are coupled in common.

The gates of the transistors T are coupled to the output of the error amplifier OP and the negative (−) side input terminal of the error amplifier OP is coupled so as to receive reference voltage VREF which the reference voltage generator 8 generates.

The positive (+) side input terminal of the error amplifier (OP) is coupled to the drains of the transistors T coupled in common. The error amplifier OP amplifies the differential voltage between the reference voltage VREF and supply voltage VCC2 so as to ensure stable output of supply voltage VDD2.

FIG. 5 illustrates an example of the layout pattern of the transistors T in the memory power supply 13.

As illustrated here, the gates of the transistors T are formed in parallel with the source pads S and drain pads D which are alternately arranged (so that the longitudinal direction of the gates is parallel to the direction of the arrangement of the source pads S and drain pads D).

Therefore, gate wirings GH coupled to the gates of the transistors T are formed in parallel to the direction of the arrangement of the source pads S and drain pads D.

For each transistor T, source wiring SH includes a first main line coupled to a source pad S and a first branch line extending from the first main line and coupled to the source. The first branch line is parallel to the gate.

Similarly, for each transistor T, drain wiring DH includes a second main line coupled to a drain pad D and a second branch line extending from the second main line and coupled to the drain. The second branch line is parallel to the gate.

These drain wirings DH and source wirings SH are formed in a comb pattern where the drain wirings DH and source wirings SH are alternately arranged.

When the sources (or drains) of the transistors T are coupled in common in this way, the area of the diffusion layer which forms the common source (or drain) can be smaller and thus the area of the memory power supply 13 can be smaller.

FIG. 6 is a sectional view taken along the line A-A' in FIG. 5 and FIG. 7 is a sectional view taken along the line B-B' in FIG. 5.

As illustrated here, for each transistor T, an n-type well 14a is formed in a p-type semiconductor substrate 14 and p-type wells 15 which function as sources and p-type wells 16 which function as drains are formed in the upper part of the n-type well 14a. A gate 17 is formed between a p-type well 15 and a p-type well 16.

Each p-type well 15 is coupled to source wiring SH formed in wiring layer M1 through a contact 18, and the source wiring SH formed in the wiring layer M1 is coupled through via holes 19 to the source wiring SH in wiring layer M2 formed above the wiring layer M1 and the source wiring SH in the wiring layer M3 formed above the wiring layer M2 respectively.

Each p-type well 16 is coupled to drain wiring DH formed in the wiring layer M1 through a contact 20 and the drain wiring DH formed in the wiring layer M1 is coupled through via holes 21 to drain wiring DH in wiring layer M2 formed above the wiring layer M1 and drain wiring DH in wiring layer M3 formed above the wiring layer M2 respectively. Each gate 17 is coupled through a contact 22 to gate wiring GH formed in the wiring layer M1.

A source pad S is coupled to the source wiring SH formed in the wiring layer M3 and a drain pad D is coupled to the drain wiring DH formed in the wiring layer M3.

Thus the wiring layers M1 to M3 have the same electric potential as the p-type wells 15 and p-type wells 16 corresponding to the diffusion layers of the transistor T, so there is no need for wiring to supply power to the wiring layers M1 to M3 and voltage drop due to such wiring to them does not occur.

FIG. 7 shows a cross section of the source diffusion layer (p-type wells 16) as the first diffusion layer of the transistor T. On the other hand, in a cross section of the drain diffusion layer (p-type wells 15) as the second diffusion layer of the transistor T, the input and output potentials in the wiring layers M1 to M3 are replaced and the source and drain diffusion layers are replaced in FIG. 7 while the sectional structure is the same.

FIG. 8 illustrates an example of the arrangement of drain wirings DH and source wirings SH in the semiconductor chip of the microcomputer 2 where a plurality of source pads S and a plurality of drain pads D are arranged alternately in a row along one edge of the semiconductor chip.

In FIG. 8, the I/O section 5, reference voltage generator 8, nonvolatile semiconductor memory 9, CPU 10, CPU power supply 11, and memory I/O section 12 are shown in the form of a block diagram to indicate a signal flow.

Since the drain pads D and source pads S are disposed along one edge of the semiconductor chip as illustrated, the wiring length of the drain wirings DH and source wirings SH can be short and the existence of many pads makes it possible to decrease the sheet resistance of the wirings (drain wirings DH and source wirings SH) and substantially reduce voltage drop.

FIG. 9 illustrates an example of the arrangement of drain wiring DH10 and source wirings SH10 in the memory power supply 50a of a microcomputer 50 which the present inventors have investigated, where source pads S10 and drain pads D10 are arranged along opposite edges of the semiconductor chip.

Again, in FIG. 9, the I/O section 51, reference voltage generator 52, nonvolatile semiconductor memory 53, CPU 54, CPU power supply 55, and memory I/O section 56 are shown in the form of a block diagram to indicate a signal flow.

In this case, the wiring length of drain wrings DH10 and source wirings SH10 is longer and the number of pads is smaller than in the case of FIG. 8, so the sheet resistance is larger and the voltage drops more.

Therefore, according to the first embodiment, since the gates 17 are parallel to the direction of the arrangement of source pads S and drain pads D of transistors T, the sheet resistance of drain wrings DH and source wirings SH is decreased and voltage drop is reduced.

Second Embodiment

Figure 10:
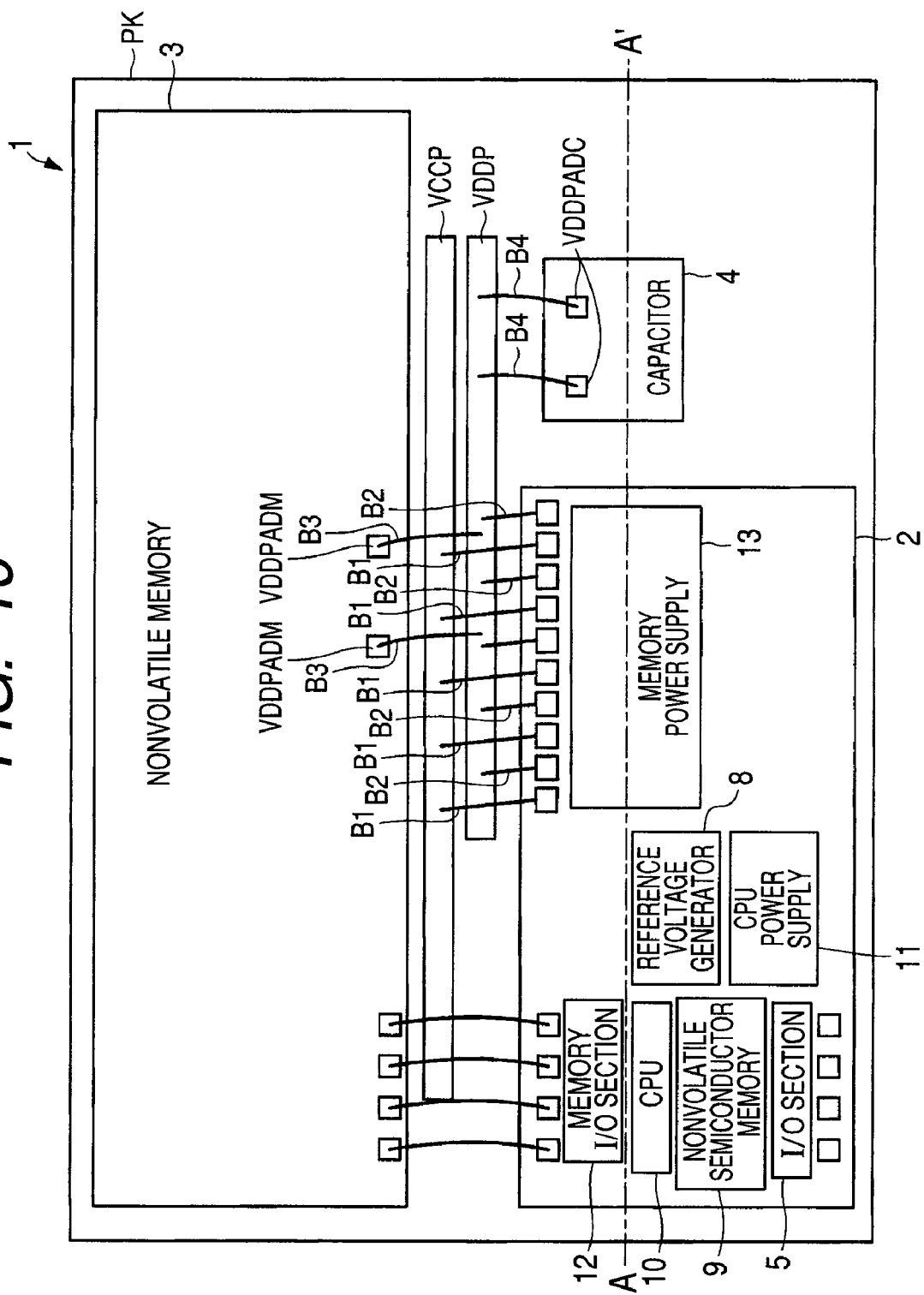
FIG. 10 illustrates an example of package layout of a semiconductor integrated circuit device according to a second embodiment of the present invention.
Figure 11:
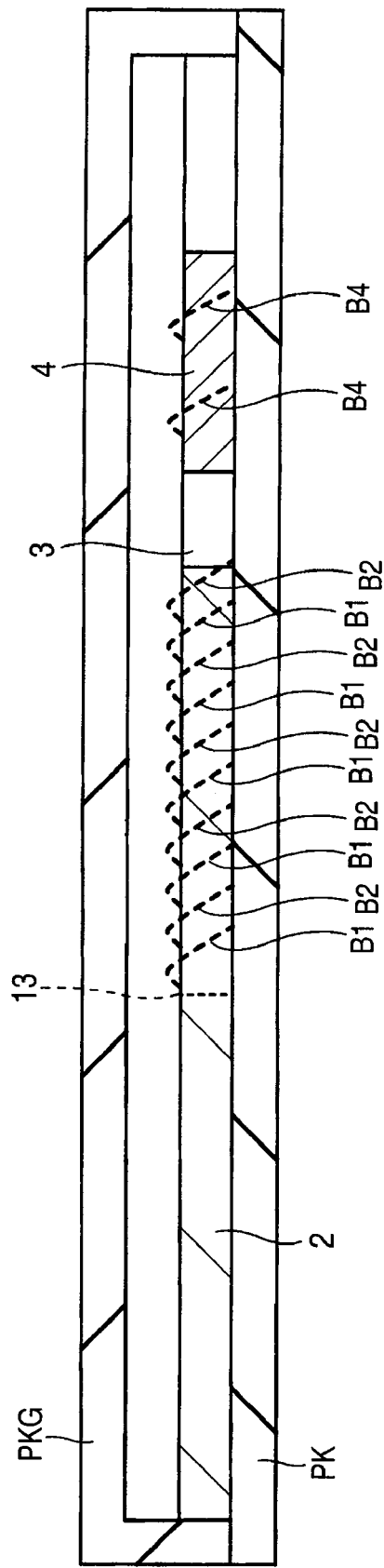
FIG. 11 is a sectional view taken along the line A-A' in FIG. 10.

FIG. 10 illustrates an example of package layout of a semiconductor integrated circuit device according to a second embodiment of the present invention and FIG. 11 is a sectional view taken along the line A-A' in FIG. 10.

As in the foregoing first embodiment (FIG. 1), a semiconductor integrated circuit device 1 in the second embodiment includes a microcomputer 2, a nonvolatile memory 3, and a capacitor 4. The microcomputer 2 and the nonvolatile memory 3 are each formed on a single semiconductor chip.

The difference from the first embodiment is the package layout of the semiconductor integrated circuit device 1.

FIG. 10 illustrates an example of package layout of a semiconductor integrated circuit device according to the second embodiment of the present invention and FIG. 11 is a sectional view taken along the line A-A' in FIG. 10.

As shown in FIG. 10, the nonvolatile memory 3 semiconductor chip lies in an upper part of a package substrate PK, and the microcomputer 2 semiconductor chip (left) and the capacitor 4 (right) lie below the nonvolatile memory 3 semiconductor chip.

Power wiring VDDP and power wiring VCCP are formed between the nonvolatile memory 3 semiconductor chip, and the microcomputer 2 semiconductor chip and capacitor 4.

The power wiring VDDP is intended to supply supply voltage VDD2 to the nonvolatile memory 3 and the power wiring VCCP is intended to supply supply voltage VCC to the microcomputer 2.

In the microcomputer 2 semiconductor chip, the memory I/O section 12, CPU 10, nonvolatile semiconductor memory 9, and I/O section 5 are arranged downward from its left upper corner in order and on the right of them the reference voltage generator 8 and CPU power supply 11 are arranged downward in order.

The memory power supply 13 lies on the right of the reference voltage generator 8 and CPU 10 in an upper part of the chip. In the peripheral area of the semiconductor chip above the memory power supply 13, source pads S and drain pads D are alternately arranged in a row along one of the edges of the semiconductor chip.

Each of the source pads S is coupled through bonding wire B1 to the power wiring VCCP and each of the drain pads D is coupled through bonding wire B2 to the power wiring VDDP.

The power wiring VDDP is coupled to power pads VDDPADM of the nonvolatile memory 3 through bonding wires B3 and to power pads VDDPADC of the capacitor 4 through bonding wires B4.

The nonvolatile memory 3, microcomputer 2, capacitor 4, bonding wires B1 to B4, drain pads D, source pads S, power wirings VDDP and VCCP, and power pads VDDPADM and VDDPADC which are all mounted over the package substrate PK are sealed with resin or the like to form a package PKG.

The arrangement and connection pattern of the source pads S and drain pads D in the memory power supply 13 and the layout pattern and wirings of transistors T in the memory power supply 13 are the same as in the first embodiment and their descriptions are omitted.

Therefore, the second embodiment also reduces voltage drop in the memory power supply and ensures stable operation of the nonvolatile memory 3.

Third Embodiment

Figure 12:
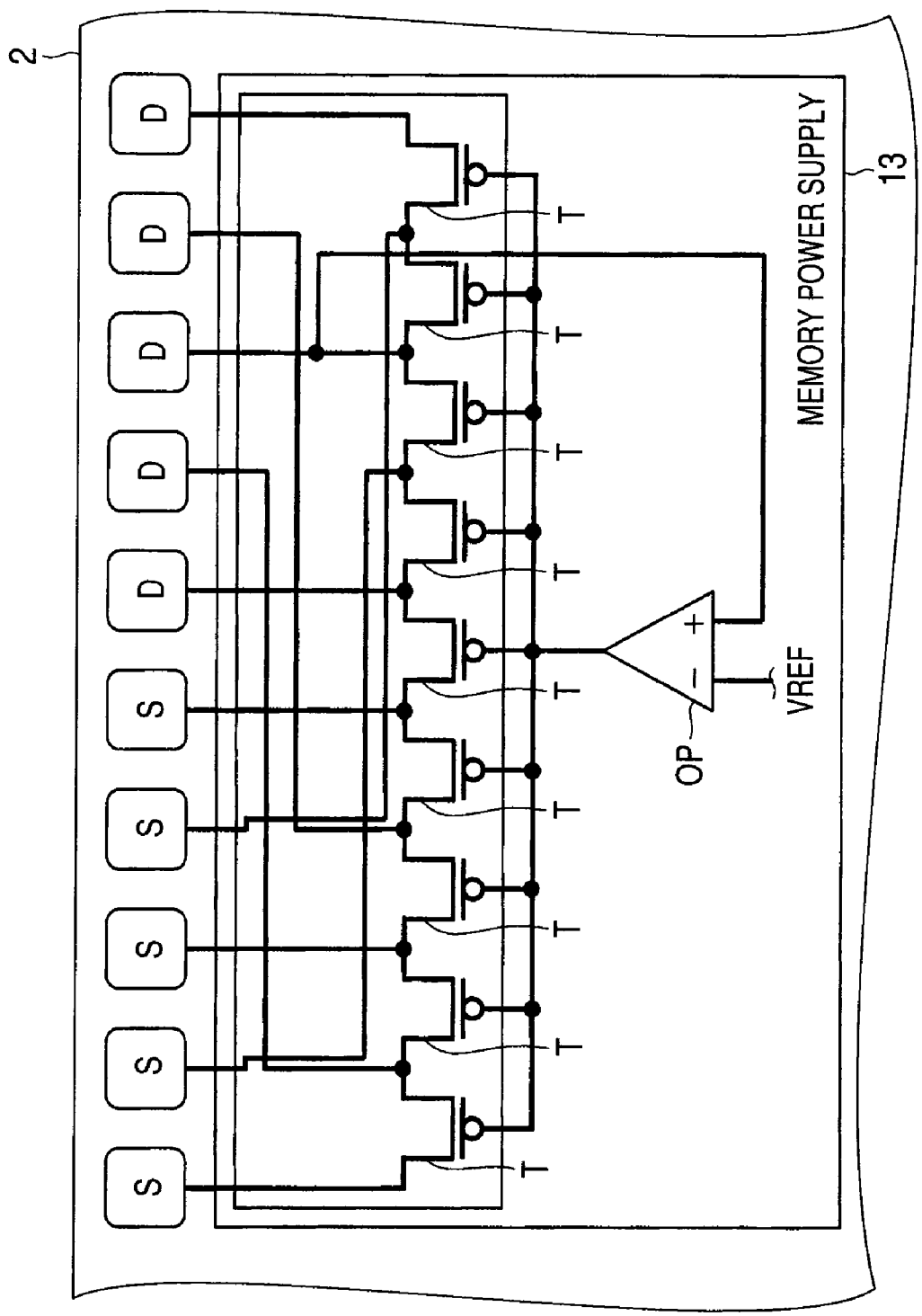
FIG. 12 illustrates an example of the arrangement and connection pattern of source pads and drain pads in a memory power supply according to a third embodiment of the present invention.
Figure 13:
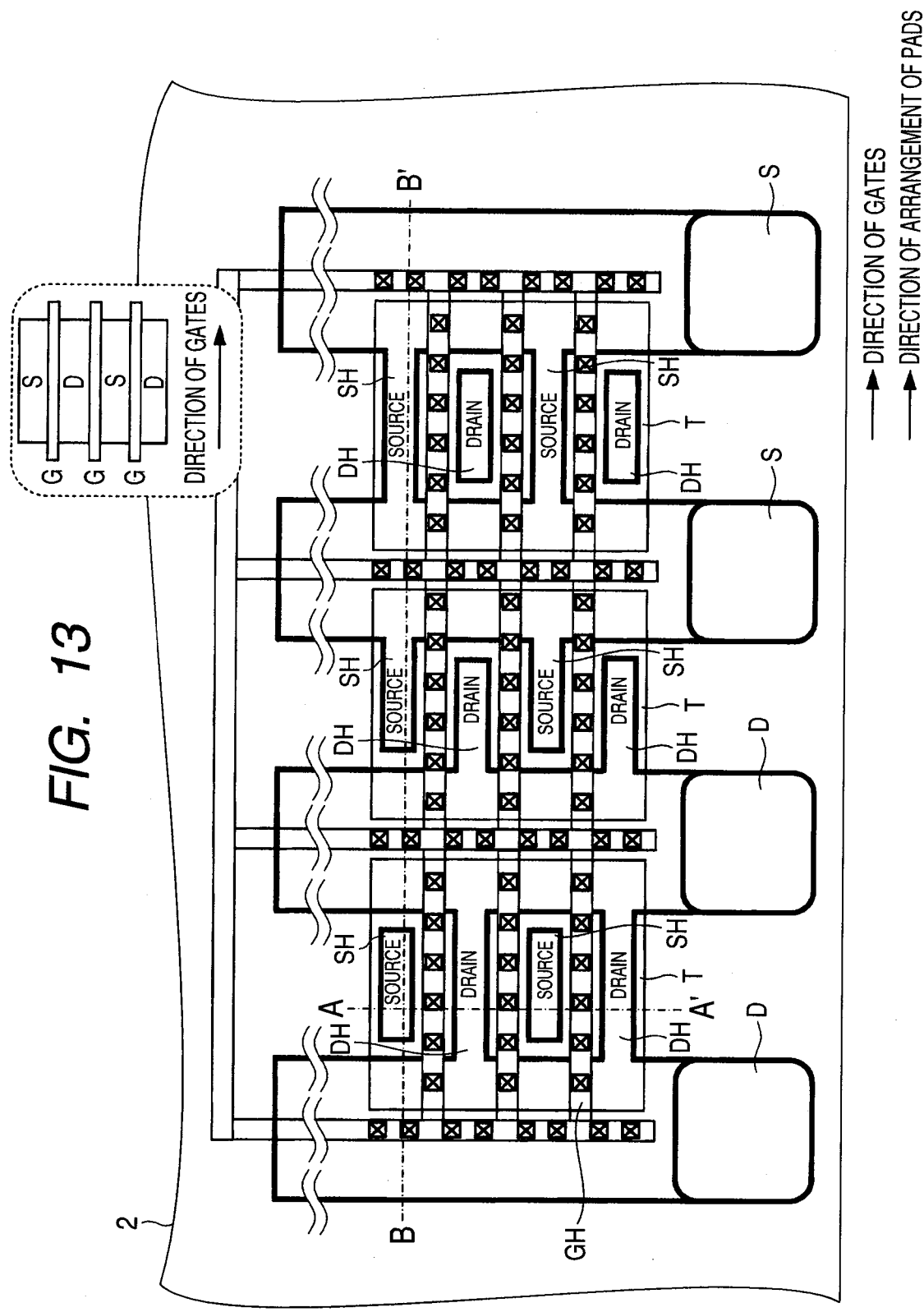
FIG. 13 illustrates an example of the layout pattern of transistors in the memory power supply shown in FIG. 12.
Figure 14:
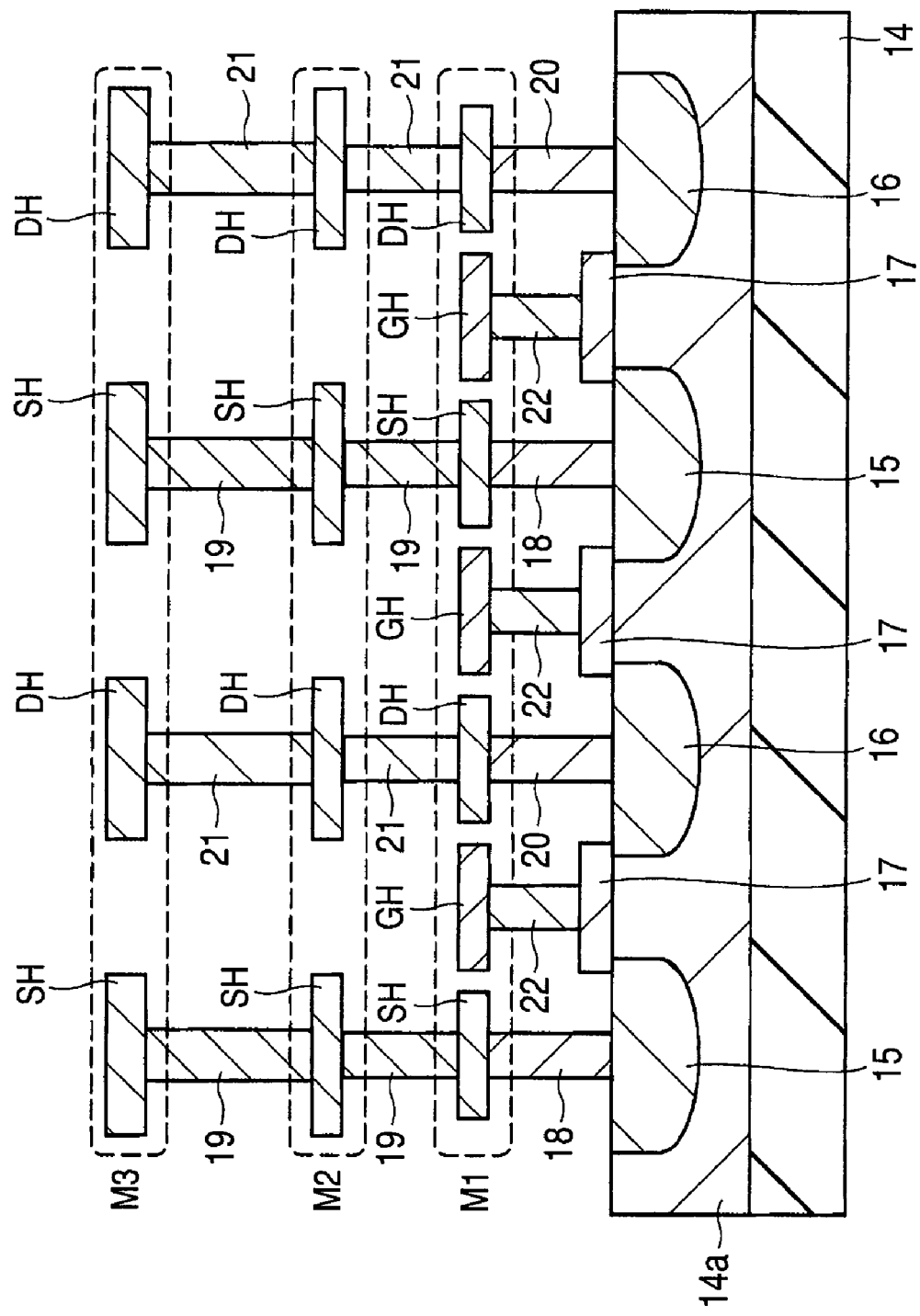
FIG. 14 is a sectional view taken along the line A-A' in FIG. 13.
Figure 15:
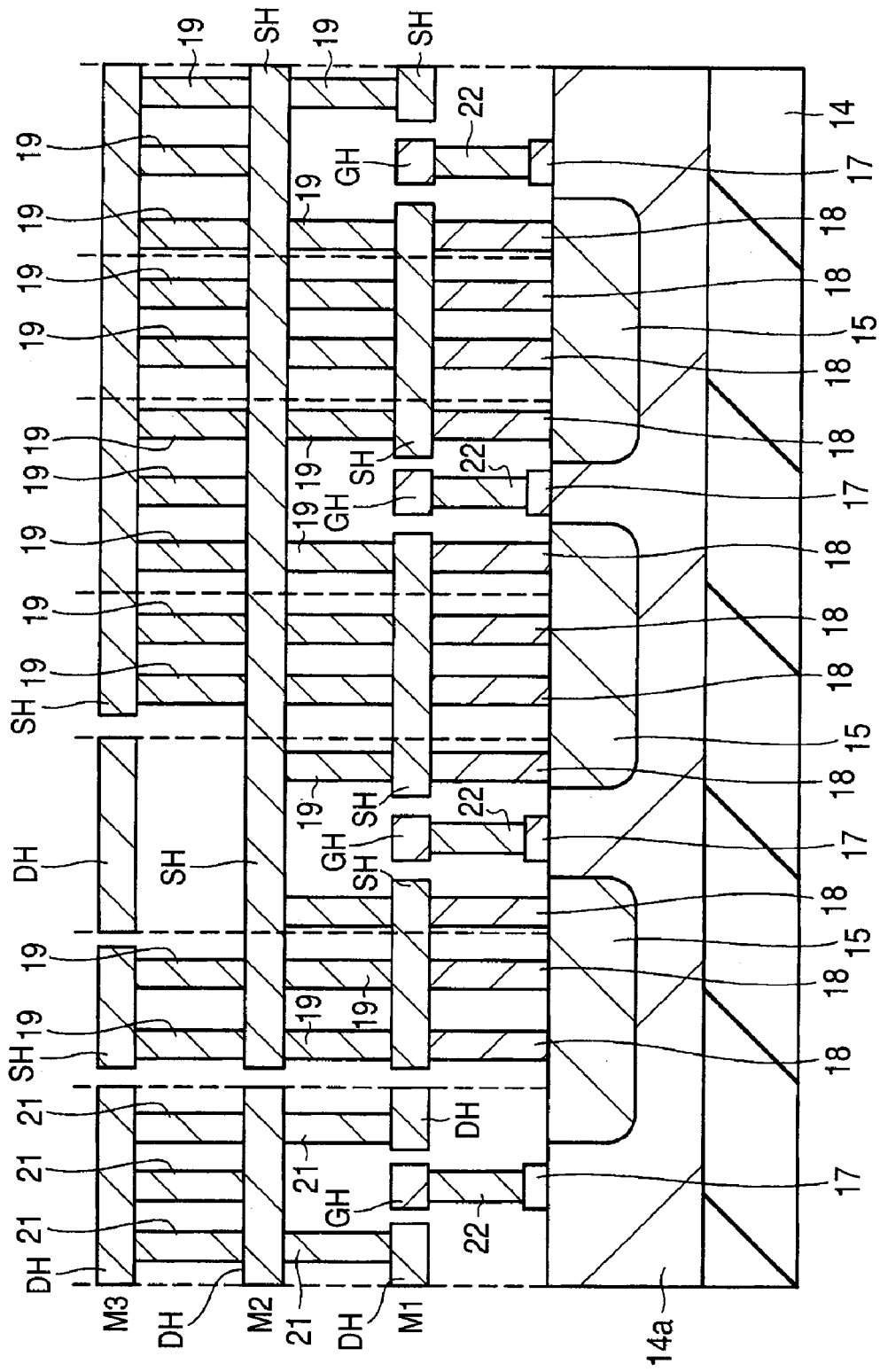
FIG. 15 is a sectional view taken along the line B-B' in FIG. 13.

FIG. 12 illustrates an example of the arrangement and connection pattern of source pads S and drain pads D in the memory power supply according to a third embodiment of the present invention; FIG. 13 illustrates an example of the layout pattern of transistors T in the memory power supply shown in FIG. 12; FIG. 14 is a sectional view taken along the line A-A' in FIG. 13; and FIG. 15 is a sectional view taken along the line B-B' in FIG. 13.

In the third embodiment, the semiconductor integrated circuit device 1 includes a microcomputer 2, a nonvolatile memory 3 and a capacitor 4 as in the first embodiment (FIG. 1). The microcomputer 2 and the nonvolatile memory 3 are each formed on a single semiconductor chip.

In the third embodiment, pads of the same type are grouped together unlike the first embodiment in which the drain pads D and source pads S in the memory power supply 13 are alternately arranged.

FIG. 12 illustrates an example of the arrangement and connection pattern of source pads S and drain pads D in the memory power supply 13 according to the third embodiment.

The memory power supply 13 includes a plurality of transistors T which serve as an output driver and an error amplifier OP as in the first embodiment. The connection pattern of these components is the same as in the first embodiment.

In this case, source pads S are grouped together and arranged in a row on the left and drain pads D are grouped together and arranged in a row on the right.

Thus, along a peripheral area of the semiconductor chip of the microcomputer 2, a plurality of source pads S are arranged in a row on the left, and on the right of them, a plurality of drain pads D are arranged in a row.

FIG. 13 illustrates an example of the layout pattern of transistors T in the memory power supply 13 shown in FIG. 12.

As illustrated here, the gates of the transistors T are formed in parallel with the source pads S and drain pads D (so that the longitudinal direction of the gates is parallel to the direction of the arrangement of the source pads S and drain pads D).

Therefore, gate wirings GH coupled to the gates of the transistors T are formed in parallel to the direction of the arrangement of the source pads S and drain pads D.

In the region where drain pads D are arranged, the transistors T's drain wirings DH which are coupled to the drain pads are so located as to surround the transistors T's source wirings SH which are coupled to the source pads.

In the region where source pads S are arranged, the source wirings SH are so located as to surround the drain wirings DH. In the boundary region between the group of drain pads D and the group of source pads S, the drain wirings DH and source wirings SH are arranged in a comb pattern.

FIG. 14 is a sectional view taken along the line A-A' in FIG. 13 and FIG. 15 is a sectional view taken along the line B-B' in FIG. 13.

As illustrated here, for each transistor T, an n-type well 14a is formed in a p-type semiconductor substrate 14 and p-type wells 15 which function as sources and P-type wells 16 which function as drains are formed in the upper part of the n-type well 14a. A gate 17 is formed between a p-type well 15 and a p-type well 16.

Each p-type well 15 is coupled to source wiring SH formed in wiring layer M1 through a contact 18, the source wiring SH formed in the wiring layer M1 is coupled through via holes 19 to the source wiring SH in wiring layer M2 formed above the wiring layer M1 and the source wiring SH in the wiring layer M3 formed above the wiring layer M2 respectively.

Each p-type well 16 is coupled to drain wiring DH formed in the wiring layer M1 through a contact 20, the drain wiring DH formed in the wiring layer M1 is coupled through via holes 21 to drain wiring DH in wiring layer M2 formed above the wiring layer M1 and drain wiring DH in wiring layer M3 formed above the wiring layer M2 respectively. Each gate is coupled through a contact 22 to gate wiring GH formed in the wiring layer M1.

A source pad S is coupled to the source wiring SH formed in the wiring layer M3 and a drain pad D is coupled to the drain wiring DH formed in the wiring layer M3.

Again, while FIG. 15 shows a cross section of the source diffusion layer (p-type wells 16) of the transistor T, in a cross section of the drain diffusion layer (p-type wells 15) as the second diffusion layer of the transistor T, the input and output potentials in the wiring layers M1 to M3 are replaced and the source and drain diffusion layers are replaced in FIG. 15 while the sectional structure is the same.

Therefore, according to the third embodiment, since the gates 17 are parallel to the direction of the arrangement of source pads S and drain pads D of transistors T, the sheet resistance of drain wrings DH and source wirings SH is decreased and voltage drop is reduced.

Fourth Embodiment

Figure 16:
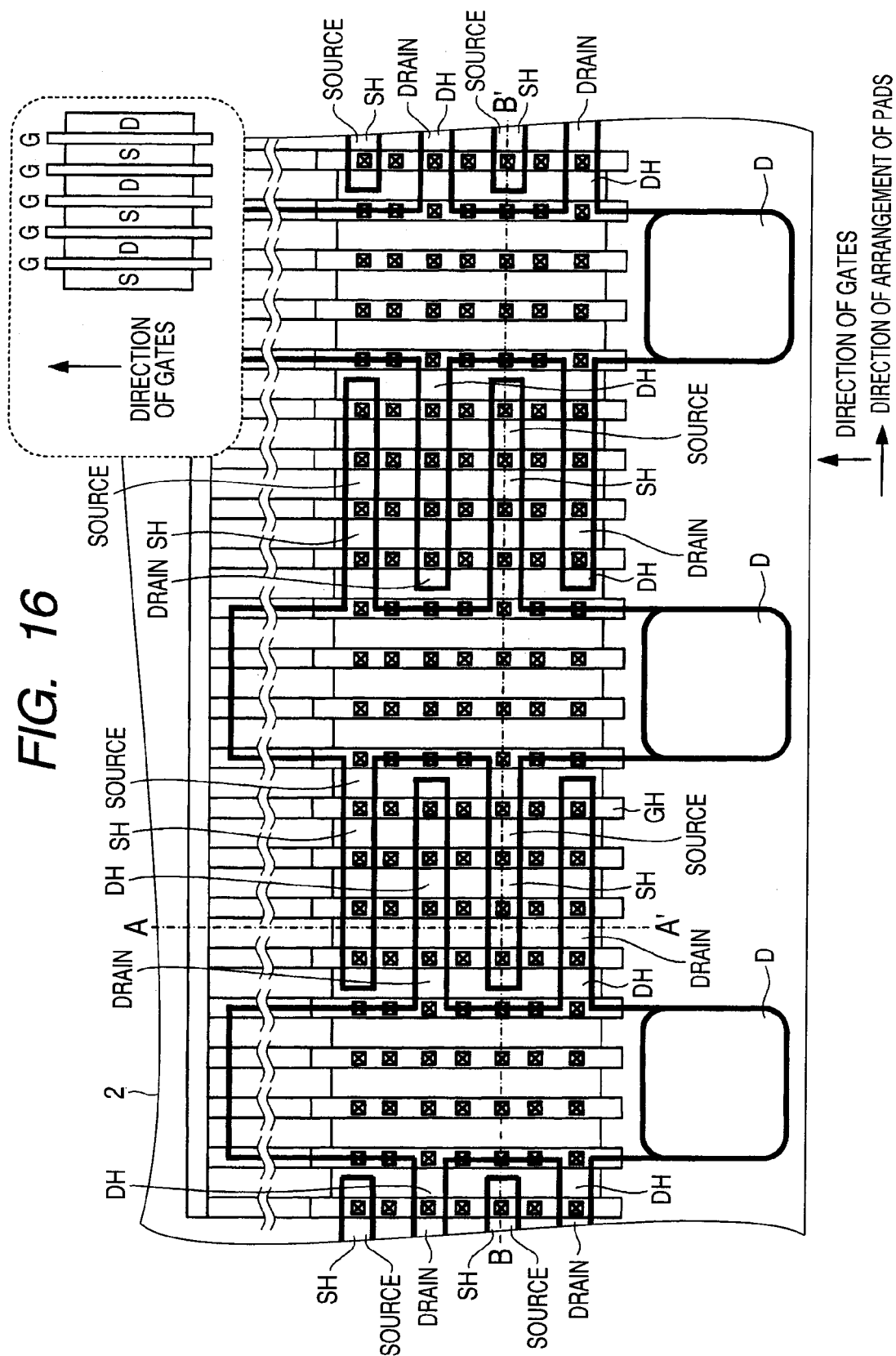
FIG. 16 illustrates an example of the layout pattern of transistors in a memory power supply according to a fourth embodiment of the present invention.
Figure 17:
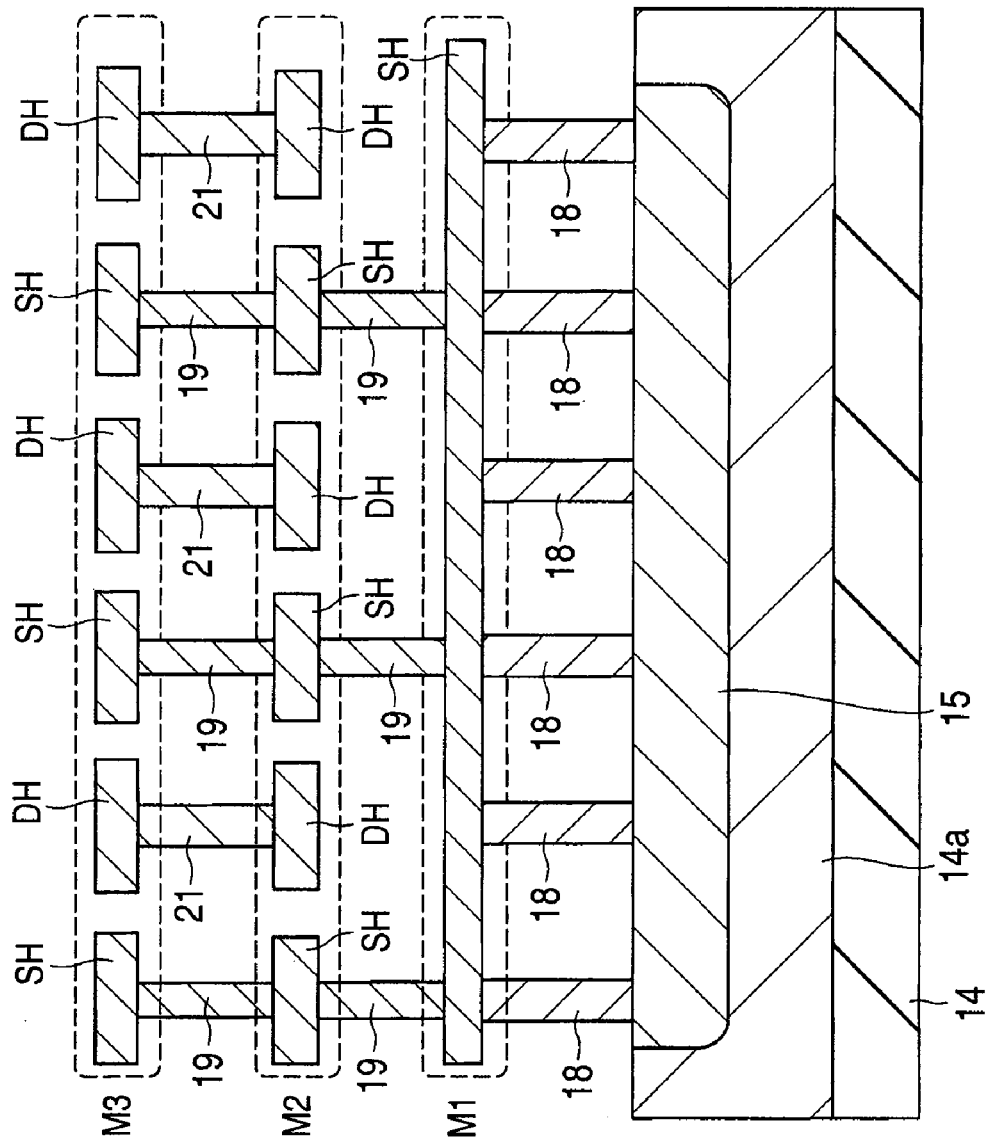
FIG. 17 is a sectional view taken along the line A-A' in FIG. 16.
Figure 18:
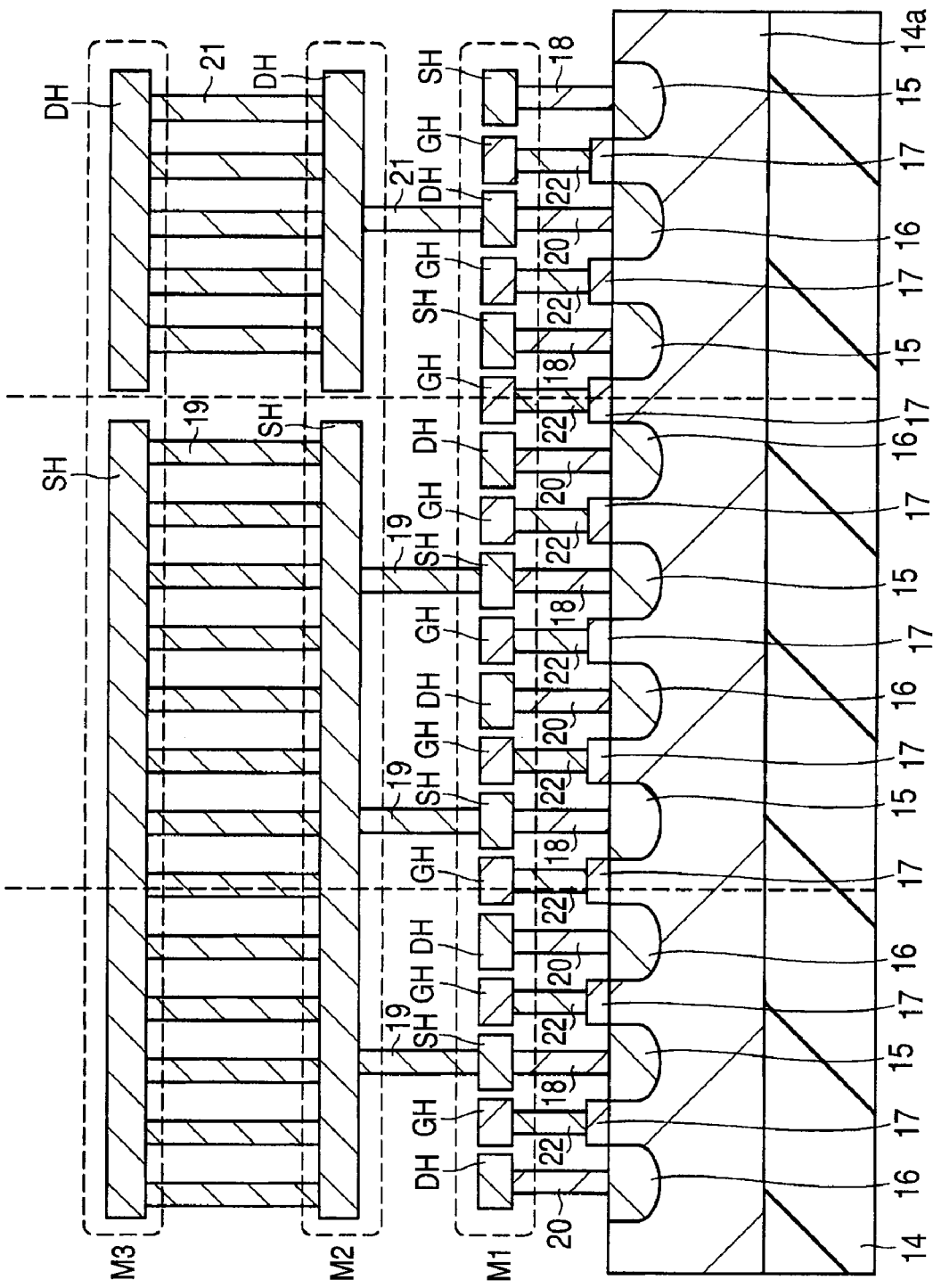
FIG. 18 is a sectional view taken along the line B-B' in FIG. 16.

FIG. 16 illustrates an example of the layout pattern of transistors in a memory power supply according to a fourth embodiment of the present invention; FIG. 17 is a sectional view taken along the line A-A' in FIG. 16 and FIG. 18 is a sectional view taken along the line B-B' in FIG. 16.

In the fourth embodiment, the semiconductor integrated circuit device 1 includes a microcomputer 2, a nonvolatile memory 3 and a capacitor 4 as in the first embodiment (FIG. 1). The microcomputer 2 and the nonvolatile memory 3 are each formed on a single semiconductor chip.

While the gates of transistors T are parallel to the direction of the arrangement of source pads S and drain pads D in the first and third embodiments, the gates of transistors T are perpendicular to the direction of the arrangement of source pads S and drain pads D in the fourth embodiment.

FIG. 16 illustrates an example of the layout pattern of transistors T in the memory power supply 13 (FIG. 4).

As illustrated here, the gates of transistors T are perpendicular to the direction of the arrangement of source pads S and drain pads D (the direction of the arrangement of source pads S and drain pads D is approximately 90 degrees to the longitudinal direction of the gates).

Therefore, the gate wirings GH coupled to the gates of transistors T are almost perpendicular to the direction of the arrangement of source pads S and drain pads D.

The drain wirings DH coupled to the drain pads of transistors T and the source wirings SH coupled to the source pads of transistors T are arranged in a comb pattern as in the first embodiment.

FIG. 17 is a sectional view taken along the line A-A' in FIG. 16 and FIG. 18 is a sectional view taken along the line B-B' in FIG. 16.

As illustrated here, for each transistor T, an n-type well 14a is formed in a p-type semiconductor substrate 14 and p-type wells 15 which function as sources and p-type wells 16 which function as drains are formed in the upper part of the n-type well 14a. A gate 17 is formed between a p-type well 15 and a p-type well 16.

Each p-type well 15 is coupled to source wiring SH formed in wiring layer M1 through a contact 18, the source wiring SH formed in the wiring layer M1 is coupled through via holes 19 to the source wiring SH in wiring layer M2 formed above the wiring layer M1 and the source wiring SH in the wiring layer M3 formed above the wiring layer M2 respectively.

Each p-type well 16 is coupled to drain wiring DH formed in the wiring layer M1 through a contact 20, the drain wiring DH formed in the wiring layer M1 is coupled through via holes 21 to drain wiring DH in wiring layer M2 formed above the wiring layer M1 and drain wiring DH in wiring layer M3 formed above the wiring layer M2 respectively. Each gate is coupled through a contact 22 to gate wiring GH formed in the wiring layer M1.

A source pad S is coupled to the source wiring SH formed in the wiring layer M3 and a drain pad D is coupled to the drain wiring DH formed in the wiring layer M3.

While FIG. 17 shows a cross section of the source diffusion layer (p-type wells 16) of the transistor T; in a cross section of the drain diffusion layer (p-type wells 15) as the second diffusion layer of the transistor T, the input and output potentials in the wiring layers M1 to M3 are replaced and the source and drain diffusion layers are replaced in FIG. 17 while the sectional structure is the same.

Therefore, according to the fourth embodiment, since the gates 17 are almost perpendicular to the direction of the arrangement of source pads S and drain pads D of transistors T, the sheet resistance of drain wrings DH and source wirings SH is decreased and voltage drop is reduced.

The invention made by the present inventors has been so far explained in reference to preferred embodiments thereof. However, the invention is not limited thereto and it is obvious that these details may be modified in various ways without departing from the spirit and scope thereof.

Figure 19:
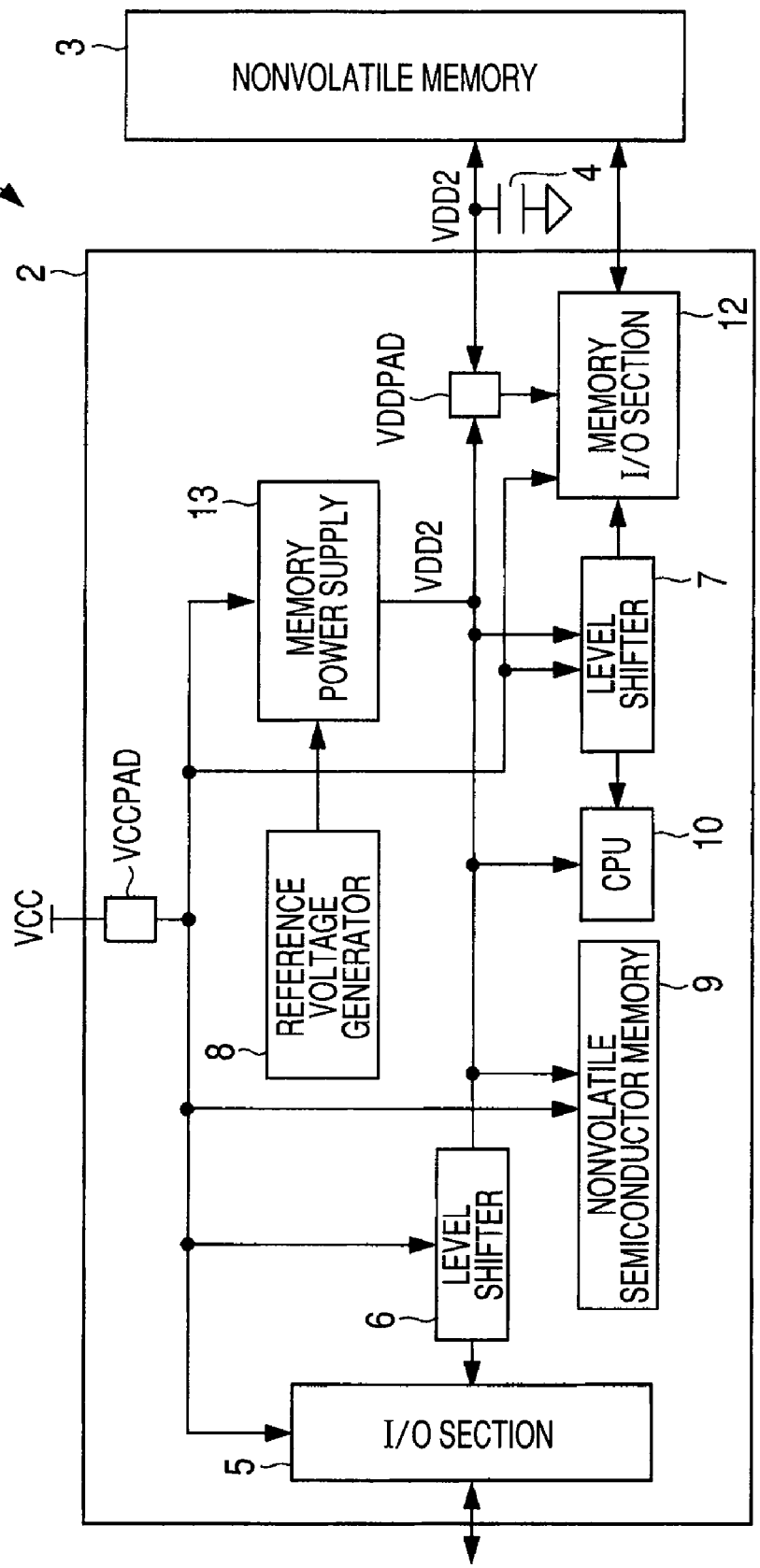
FIG. 19 is a block diagram showing the configuration of a semiconductor integrated circuit device according to another embodiment of the present invention.

For example, the first embodiment has a CPU power supply which generates supply voltage VDD1 from supply voltage VCC and supplies the supply voltage VDD1 to the levels shifters 6 and 7, nonvolatile semiconductor memory 9, CPU 10 and memory I/O section 12. Instead, as illustrated in FIG. 19, it is also possible that supply voltage VDD2 generated by the memory power supply 13 is supplied to the levels shifters 6 and 7, nonvolatile semiconductor memory 9, CPU 10 and memory I/O section 12.

The present invention is suitable for technology which stably supplies supply voltage to a nonvolatile memory in a system-in-package device.

What is claimed is:

1. A semiconductor integrated circuit device having a regulator for converting a DC supply voltage into a given DC voltage,
the regulator comprising:
an output driver including a plurality of transistors;
input voltage pads for supplying the supply voltage to sources of the transistors; and
output voltage pads coupled to drains of the transistors to output the given DC voltage,
wherein the input voltage pads and the output voltage pads are arranged in a row along one edge of a semiconductor chip where the regulator is formed, and
wherein gates of the transistors are parallel to arrangement of the input voltage pads and the output voltage pads.

2. The semiconductor integrated circuit device according to claim 1, further comprising:
a first main line coupled to the input voltage pads;
a first branch line extending from the first main line to supply a voltage to a first diffusion layer of the transistors;
a second main line coupled to the output voltage pads; and
a second branch line extending from the second main line to supply a voltage from a second diffusion layer of the transistors to the output voltage pads,
wherein the first branch line and the second branch line are parallel to the arrangement of the input voltage pads and the output voltage pads.

3. The semiconductor integrated circuit device according to claim 1, wherein the input voltage pads and the output voltage pads are alternately arranged.

4. The semiconductor integrated circuit device according to claim 1,
wherein the input voltage pads are arranged in a first row as a first group,
wherein the output voltage pads are arranged in a second row as a second group, and
wherein the first group and the second group are arranged in the row.

5. The semiconductor integrated circuit device according to claim 1, wherein the transistors are coupled in parallel with each other while their sources, drains and gates are coupled in common respectively.

6. The semiconductor integrated circuit device according to claim 1,
wherein the semiconductor integrated circuit device is a system in package including at least two semiconductor chips, and
wherein the regulator supplies the given DC voltage to the other semiconductor chip where the regulator does not exist, or another semiconductor chip externally coupled to the semiconductor integrated circuit device.

7. The semiconductor integrated circuit device according to claim 1, wherein the regulator supplies the given DC voltage to another semiconductor chip externally coupled to the semiconductor integrated circuit device.

8. The semiconductor integrated circuit device according to claim 1, wherein the semiconductor integrated circuit device is a controller having a CPU.

* * * * *